United States Patent [19]

Hoffmann et al.

[11] 4,156,289

[45] May 22, 1979

[54] SEMICONDUCTOR MEMORY

[75] Inventors: Kurt Hoffmann, Taufkirchen; Rudolf Mitterer, Gauting, both of Fed. Rep. of Germany

[73] Assignee: Siemens Aktiengesellschaft, Berlin & Munich, Fed. Rep. of Germany

[21] Appl. No.: 872,443

[22] Filed: Jan. 26, 1978

[30] Foreign Application Priority Data

Jan. 31, 1977 [DE] Fed. Rep. of Germany ....... 2703871

[51] Int. Cl.² ............................................. G11C 11/40
[52] U.S. Cl. ..................................... 365/182; 357/55; 365/178; 365/186
[58] Field of Search ............................ 357/20, 55, 60; 365/174, 178, 182, 186

[56] References Cited

U.S. PATENT DOCUMENTS 4,003,036  1/1977  Jenne ..................................... 357/20

Primary Examiner—Stuart N. Hecker
Attorney, Agent, or Firm—Hill, Gross, Simpson, Van Santen, Steadman, Chiara & Simpson

[57] ABSTRACT

A semiconductor memory has at least one V-MOS transistor which includes a trench and a storage capacitor. A semiconductor substrate is doped with concentration centers of a first conductivity type and has a buried layer which is doped with concentration centers of a second conductivity type opposite to the first conductivity type. At least two additional layers are divided by the trench and have alternately differing conductivity types, the two additional layers and the buried layer being produced by diffusion and/or implantation.

5 Claims, 6 Drawing Figures

SEMICONDUCTOR MEMORY

BACKGROUND OF THE INVENTION

1. Field of the Invention

The present invention relates to a semiconductor memory which has at least one V-MOS transistor, including a trench, and having a storage capacitor, and more particularly to such a semiconductor memory in which a semiconductor substrate is doped with doping concentration centers of a first conductivity type and has a buried layer which is doped with concentration centers of a second, opposite conductivity type, and in which at least two additional layers are provided and are divided by the trench and are of alternately differing conductivity types.

2. Description of the Prior Art

Semiconductor storage cells comprising a transistor (single-transistor storage cells) can be constructed from MOS transistor, which is also referred to as a selector transistor. The selector transistor is connected to a storage capacitor in which the item of information to be stored is contained as a charge. The storage cell composed of the selector transistor and the storage capacitor is connected between a word line and a bit line. Here, the word line is connected to a control input (a gate) of the selector transistor, whereas one control electrode of the transistor is connected to the bit line and the controlled electrode is connected to the storage capacitor. Single-transistor storage cells of this kind have the advantage that they can be constructed on a semiconductor substrate with a very low space requirement.

As is known in the art, MOS transistors can be produced by means of so-called V-MOS technique in which, for the control of the MOS transistor, a V-shaped trench is etched into an epitaxial layer carried on a semiconductor substrate. An insulating layer is arranged in the trench and carries a terminal for the control electrode of the MOS transistor. The channel of the MOS transistor extends in the flanks of the V-shaped trench. The two control electrodes of the MOS transistor can, for example, be arranged beside the V-shaped trench.

A semiconductor storage cell which comprises a MOS selector transistor controlled by a drive line and a storage capacitor connected to the selector transistor, and wherein the selector transistor is produced in the V-MOS technique, can now be constructed in such a manner that in a semiconductor substrate highly doped with concentration centers of one conductivity type, there is arranged a buried layer which is highly doped with concentration centers of the opposite conductivity type, that an epitaxial layer, weakly doped with concentration centers of the one conductivity type, is arranged above the buried layer and the semiconductor substrate, and that a V-MOS transistor is arranged as a selector transistor in the epitaxial layer above the buried layer, where the trench required for the formation of the selector transistor extends through the epitaxial layer into the buried layer.

This single-transistor storage cell has a very high bit density and can be produced by conventional light-exposure with structure resolutions 5 μm. However, an epitaxial layer is required which impedes mass production.

SUMMARY OF THE INVENTION

Therefore, the object of the present invention is to provide a semiconductor memory of the type generally described above which does not have an epitaxial layer.

This object is realized, according to the invention, in that in addition to the buried layer, two further layers are produced by diffusion and/or implantation in the semiconductor substrate.

According to another feature of the invention, the trench divides the buried layer into two parts.

It is advantageous for one of the layers to consist of a bit line.

Another feature of the invention resides in the fact that the layer which adjoins the surface of the semiconductor body forms the bit line.

Finally, it is also advantageous for the buried layer to form the bit line.

A semiconductor memory constructed in accordance with the invention is characterized by a simple construction without an epitaxial layer. As a result, structures embodying the invention can be produced particularly simply and such structures are thus suitable for mass production.

BRIEF DESCRIPTION OF THE DRAWING

Other objects, features and advantages of the invention, its organization, construction and operation will be best understood from the following detailed description, taken in conjunction with the accompanying drawing, on which.

DESCRIPTION OF THE PREFERRED EMBODIMENTS

Figure 1:
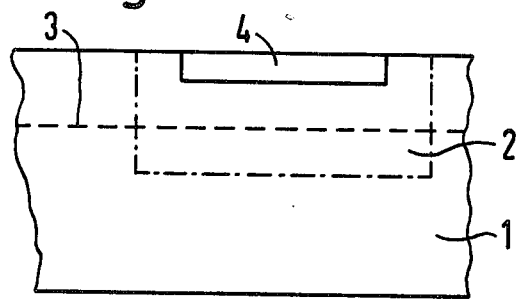
FIGS. 1 and 2 illustrate the production of a semiconductor memory in accordance with the invention by way of a first exemplary embodiment.

Referring to FIG. 1, an n+-doped zone 2 has a doping concentration of approximately $10^{\neq}$centers/cm$^3$ which is introduced by diffusion or ion implantation into a p-doped semiconductor material. Then n+ diffusion represents a part of the buried pn storage capacitor then, employing diffusion of ion implantation, a p+ conducting zone 3 is formed on the entire surface, which serves as a channel stop and is provided to form the buried storage capacitor. Finally, a n+conducting zone 4 is then formed by diffusion or by ion implantation, and serves for the source zone and the drain zone. The zone 3 has a doping concentration of $10^{\sim}$centers/cm$^3$. The zone 4 has a doping concentration of $5 \times 10$centers/cm$^3$.

The arrangement illustrated in FIG. 1 is formed in this manner.

Then a trench 5 (FIG. 2) is introduced into the surface of the arrangement illustrated in FIG. 1, which can be effected by means of a photo-lacquer and etching technique. A thick oxide layer 7 is then produced on the remaining surface, whereas a thin oxide layer 6 is formed on the surfaces of the trench 5.

The thick oxide layer 7 and the thin oxide layer 6 each consist of silicon dioxide.

Figure 2:
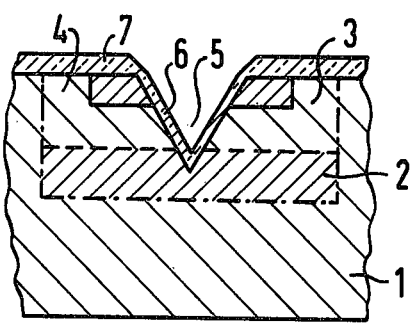

Thus, the arrangement illustrated in FIG. 2 possesses n-conducting zones 2 and 4 and p-conducting zones 1 and 3. The zone 2, forms the storage capacitor.

The zone 4 serves as a bit line. The zone 3 between the zone 4 and the zone 2 of the storage capacitor represents the selector transistor.

Figure 3:
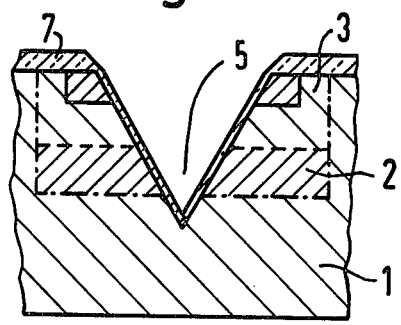
FIG. 3 illustrates a further exemplary embodiment of the invention.

FIG. 3 illustrates an arrangement which is similar to that illustrated in FIG. 2. This semiconductor memory differs from the semiconductor memory in FIG. 2 merely by virture of the fact that the trench 5 extends to the semiconductor material 1.

In the exemplary embodiments illustrated in FIGS. 1-3, the pn storage capacitor is, in each case, arranged beneath the bit line 4 and the transfer gate. If, however, one assumes a doping as described above, the surface-related pn storage capacitance will be lower than the surface-related bit line capacitance.

In order to improve upon this generally unfavorable ratio between the pn storage capacitance and the bit line capacitance, the bit line can be exchanged with the pn storage capacitor.

Figure 4:
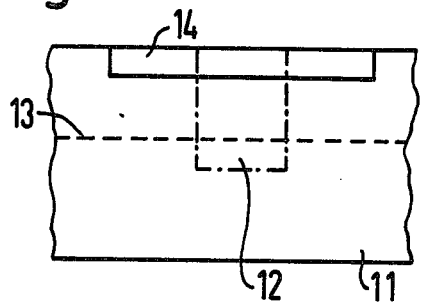
FIGS. 4 and 5 illustrate the production of a semiconductor memory in accordance with the invention in a third exemplary embodiment thereof.
Figure 5:
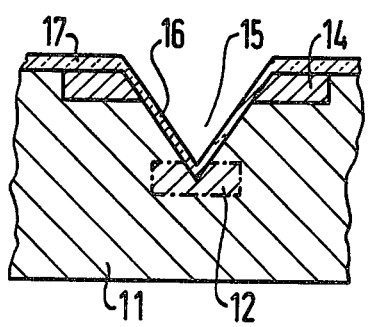
Figure 6:
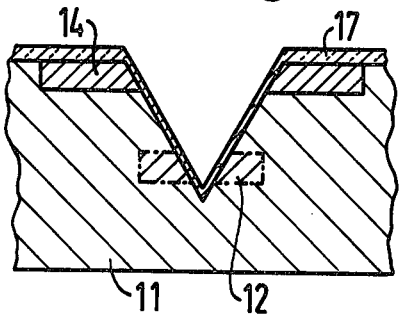
FIG. 6 illustrates a fourth exemplary embodiment of the invention.

Relevant exemplary embodiments are illustrated in FIGS. 4-6.

In FIG. 4, a n-conducting zone 12 is introduced into a p-conducting semiconductor material 11 at a doping concentration of $10^{16}$ centers/cm$^3$. Thus, the zone 12 has smaller lateral dimensions than the zone 2 in FIG. 1. Then, as in the exemplary embodiment of FIG. 1, a p+ zone 13 is produced with a doping concentration of $5 \times 10^{17}$/cm$^3$. Finally, a n+ zone 14 with a doping concentration of $5 \times 10^{19}$ centers/cm$^3$ if formed. The zones 12, 13 and 14 can each be formed by diffusion or by ion implantation.

A trench 5 is produced in the surface of the arrangement of FIG. 5 and can extend to the zone 12 (FIG. 5) or through the zone 12 to the semiconductor material (FIG. 6). A thin oxide layer 16 consisting of silicon dioxide is formed in the trench. A thick oxide layer 17 consisting of silicon dioxide is produced on the surface outside of the trench.

In the exemplary embodiment illustrated in FIG. 5, the zones 12 and 14 are n-conducting, whereas the zone 11 is p-conducting.

The zones 14 form the storage capacitor, the transfer gate lies between the zones 14 and 12 and the zone 12 represents the bit line.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a semiconductor memory of the type which has at least one V-MOS transistor including a trench and a storage capacitor, and in which in a semiconductor substrate doped with a dopant of a first conductivity type there is a buried layer which is doped with a dopant of a second conductivity type which is opposite to the first conductivity type, the improvement therein comprising:

a first additional non-epitaxial layer carried by said substrate; and a second additional non-epitaxial layer carried by said first additional layer, said additional layers having alternately differing conductivity types and being divided by the trench, said trench extending through all of the layers, including said buried layer, to divide said buried layer into two parts.

2. The improved semiconductor memory of claim 1, wherein said additional layers and said buried layer are diffused layers.

3. The improved semiconductor memory of claim 1, wherein said additional and said buried layers are ion implanted layers.

4. The improved semiconductor memory of claim 1, wherein said first additional layer which adjoins the surface of the semiconductor body constitutes a bit line.

5. The improved semiconductor memory of claim 1, wherein a buried layer constitutes said bit line.

* * * * *